United States Patent [19]

Kumada

[11] 4,071,841
[45] Jan. 31, 1978

[54] DIELECTRIC MATRIX DEVICE

[75] Inventor: Akio Kumada, Kokubunji, Japan

[73] Assignee: Hitachi, Ltd., Japan

[21] Appl. No.: 624,338

[22] Filed: Oct. 21, 1975

[30] Foreign Application Priority Data

Oct. 21, 1974 Japan .................. 49-120387

[51] Int. Cl.² .................. G11C 11/22; G11C 11/42
[52] U.S. Cl. .................. 365/65; 350/150; 365/117
[58] Field of Search .............. 317/101 CE; 340/173.2, 340/173 PL, 173 CA, 324 FE; 350/150

[56] References Cited

U.S. PATENT DOCUMENTS

| 3,106,606 | 10/1963 | Fuller et al. | 340/173 R |
| 3,767,975 | 10/1973 | Glenn | 317/101 CE |
| 3,777,221 | 12/1973 | Tatusko | 317/101 CE |
| 3,806,228 | 4/1974 | Imagawa et al. | 340/173.2 |
| 3,806,629 | 4/1974 | Cocca | 317/101 CE |
| 3,868,652 | 2/1975 | Cooper et al. | 340/173.2 |

*Primary Examiner*—Stuart N. Hecker
*Assistant Examiner*—Donald McElheny
*Attorney, Agent, or Firm*—Craig & Antonelli

[57] ABSTRACT

For dielectric matrix devices, plural stripe-shaped vertical and horizontal electrodes are crossed with each other respectively and disposed on the front surface of a predetermined dielectric plate, while on the back surface of said dielectric substrate independent electrodes are disposed on both the corresponding portions to the crossed areas of horizontal and vertical electrodes and the neighboring portions to these areas.

The present dielectric matrix element is characterized in that the lead wire to the horizontal and vertical electrodes disposed on the dielectric substrate is connected to only one side of this dielectric substrate.

27 Claims, 12 Drawing Figures

DIELECTRIC MATRIX DEVICE

FIELD OF THE INVENTION

The present invention relates to a dielectric matrix device in which the horizontal electrodes (or X electrodes) together with the vertical electrodes (or Y electrodes) are disposed onto the same major surface of the dielectric plate, while on the opposite major surface of the above dielectric plate, independent electrodes are disposed which cover both the corresponding portions to the crossed area between horizontal and vertical electrodes and the neighbouring portions to these crossed areas.

BRIEF DESCRIPTION OF THE DRAWINGS

FIG. 6b is a mode diagram of electric voltage applied versus time to the electrode in the matrix device in accordance with the present invention having an equivalent circuit diagram as shown in FIG. 6a.

PRIOR ART OF THE INVENTION

Figure 1A:
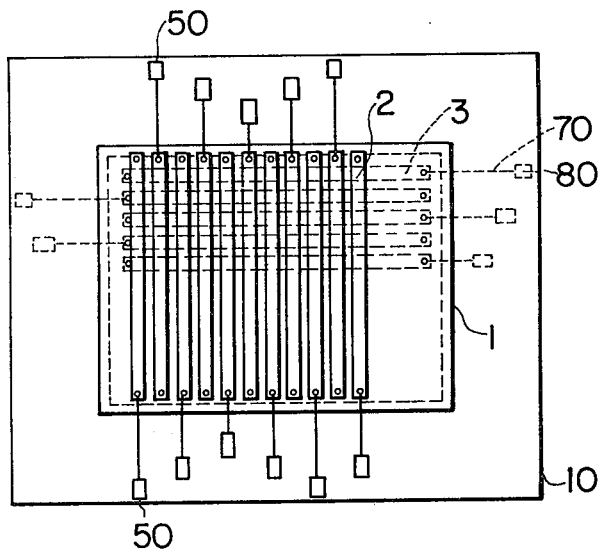
FIGS. 1a and 1b is a front view and a longitudinal cross-sectional view of the matrix device in accordance with the prior devices employing ferroelectric transparent ceramics, respectively.
Figure 1B:
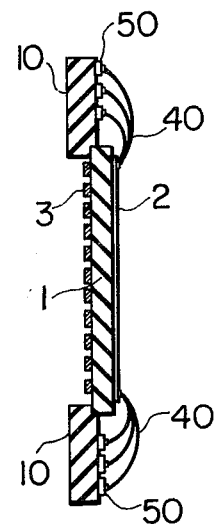

A conventional dielectric matrix element was constructed with horizontal and vertical electrodes which were disposed onto the front and back major surfaces of a dielectric plate, respectively. As above-mentioned, because the vertical and horizontal electrodes were disposed onto both major surfaces of the dielectric plate, respectively, each lead wire connecting each electrode must connect to each major surface of the above dielectric plate. For example, as is shown in FIGS. 1a and 1b, the stripe-shaped transparent electrodes 2 coated by sputtering are fixed in a periodic spacing onto a front surface of a dielectric plate 1, while onto the back surface of the plate 1, stripe-shaped $In_2O_3$ – $SnO_2$ electrodes are coated by the same method as above-mentioned, in the direction of crossing with the electrodes 2. Also, dot-shaped Cr – Au films are coated onto the end part of these stripe-shaped electrodes 2, and Au-wire 40 and 70 are connected to the Cr – Au films by a bonding method, and further Au-wire 40 and 70 are connected to the terminals 50 and 80, respectively which had been coated by a vaporizing method onto the supporting frame 10. For example, vertical and horizontal electrodes are fixed onto the dielectric matrix element employing a dielectric transparent ceramic plate as the substrate, and further a signal electric voltage applied to each electrode, resulted in information storage, that is, a change of the dielectric polarization in accordance with the said signal electric voltage. Therefore, because the magnitude of the dielectric polarization or the light scattering was changed in accordance with the change of the dielectric polarization, the stored information could be displayed according to the change of the intensity of the optical characteristics of the element substrate.

For example, required video signals were received and lead to the dielectric element as shown in FIGS. 1a and 1b and the first electric pulse having a given horizontal scanning time which was synchronized with the scanning signal (a time width is given as a horizontal scanning time, that is about 60 $\mu$ sec.) was supplied to a first electrode 3 among the horizontal electrodes group 3, after the first electric pulse, to the second electrode 3 among the horizontal electrodes group 3, the second electric pulse which was the same as the first one was supplied. By this method, the above electric pulses were also supplied to the remaining horizontal electrodes 3 in succession. And further, at the same time, a video signal was supplied to the gate electrodes connected to the vertical electrodes, and it was favourable to control the electric current according a video signal.

However, in order to realize such a flat panel television set, there are many problems. The first problem is as follows; since the thickness is thin compared with the size of the plate 1, this thin plate flat panel television set is mechanically weak to handle. Accordingly, in order to improve this weak point, it is required to fix said thin plate to a supporting plate. And, generally, a flat panel television set has two types, first is an image projection type and second is a direct view type in which displayed images can be observed by reflecting or absorbing the ambient light at the back surface of the panel.

In order to strengthen the mechanical strength of these panels, the projection type panel requires a transparent supporting plate, but the direct view type panel does not necessarily require a transparent supporting plate.

When the panel is fixed to the supporting plate at one surface, for example, the coated surface with the electrodes 3, lead wires cannot bond to the electrodes 3, since the surface of the electrodes 3 is covered by the supporting plate.

The second problem is as follows; the technique of bonding the plural lead wires to each stripe-shaped electrode requires a higher level skill, because the panel of the matrix display is generally constituted by a number of stripe-shaped electrodes, for example 250 lines and 250 columns. An ultrasonic bonding is a favourable method to bond plural lead wires into the small area of plural terminals.

However, it is impossible to carry out the lead wire bonding to the terminals on both the back and front surfaces at the same time. This is the second problem associated with the structure as shown in FIGS. 1a and 1b. Further, it is difficult to put all the electrode terminals on the same side surface of the plate 1. And moreover, since the head of the bonding apparatus cannot be inserted into deep places, and if the thickness of the supporting plate 10 is too thick to carry the bonding between the terminals of the supporting plate and the terminals of the electrode 3, we are forced to particularly improve the form of the supporting frame. Then the construction of the apparatus becomes complicated and results in a requirement of higher cost for the supporting frame.

In order to solve the above problems, we have devised a structure which consists of both the electrodes 2 and 3 disposed on the same surface of the panel 1, and improved the construction of the electrodes to realize matrix operation.

SUMMARY OF THE INVENTION

The principal object of this invention is to provide a dielectric matrix device having the vertical and horizontal line electrodes which surfaces are not at all covered by the supporting plate.

And, the second object of this invention is to provide a dielectric matrix device of a suitable construction which makes simultaneous bonding of the lead wires to the vertical and horizontal electrodes possible.

The features of the present invention are that a predetermined dielectric substrate is employed, and plural stripe-shaped vertical and horizontal electrodes crossing each other are disposed on the same one surface of the above-mentioned dielectric substrate, and on the opposite surface of the above-mentioned substrate, independent electrodes are disposed at the portions corresponding to both portions of the crossed protions of horizontal and vertical electrodes and the neighbouring portions to said crossed portions between the horizontal and vertical electrodes. Because, in the dielectric device of the present invention, the vertical and horizontal electrodes are disposed onto the same surface of the substrate, the connection of the lead wires to these electrodes is easy. And, even if the dielectric substrate is fixed to the supporting plate, the device has no demerit of being covered with the supporting plate.

DESCRIPTION OF THE PREFERRED EMBODIMENT

Embodiment 1.

High purity powders of PbO, $ZrO_2$, $TiO_2$ and $La_2O_3$ were weighed by amounts for providing a composition of $Pb_{1-x}La_x(Zr_{1-y}Ti_y)_{1-(x/4)} \cdot O_3$. The powders were calcined at 800° ~ 900° C, and the composition material according to the above-mentioned chemical formula was produced through the solid phase reaction. These products were pulverized and molded, and hot-pressed under 2000~3000 pond per square inch (hereinafter, psi), at 1200° C for 5~500 hours in an oxygen atmosphere. Thus, produced boules were core-drilled, and sliced to form disks of required thickness by means of a diamond cutter. Both the major surfaces of each disk were polished roughly into parallel, and finally into optical flat planes by pitch lapping, and thus transparent ceramic plates were obtained.

These ceramic plates are made of solid solution system, and the values $x$, $y$ in the above chemical formula could be selected arbitrarily. But, the properties of these transparent ceramics are different in accordance with the ratio of x and y. Accordingly, it is conventional to represent their composition by means of solid solution ratio as $x/1-y/y$ PLZT. Namely, 7/65/35 PLZT represents the composition of $Pb_{0.93}La_{0.07}(Zr_{0.65}Ti_{0.35})(3.93/4) \cdot O_3$.

Figure 2A:
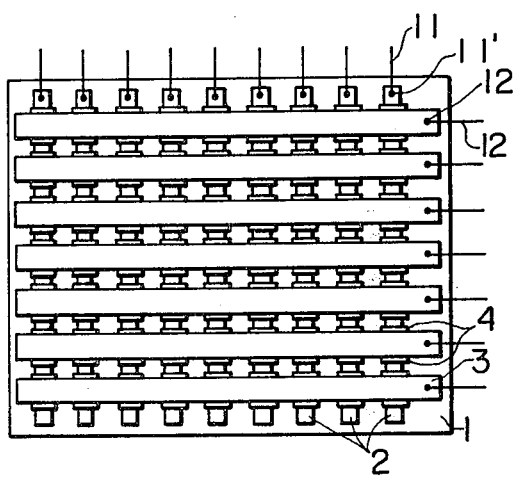
FIGS. 2a, 2b and 2c is a front view, a longitudinal cross-section view and a rear view of the matrix element of one embodiment in accordance with the present invention, respectively.
Figure 2C:
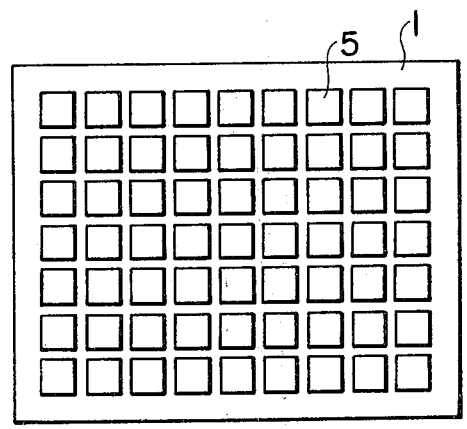
Figure 2B:
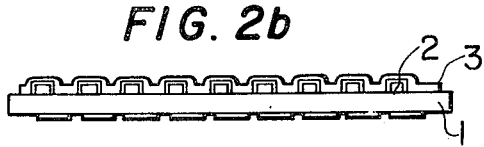

The above 7/65/35 PLZT is a ferroelectric transparent ceramic. In this embodiment, the boule of 7/65/35 PLZT was cut and sliced to form a disk. This disk was polished, and the surfaces of this disk were finished by the optical lapping, into a ceramic plate having a dimension of 150 μm in thickness, 30 mm × 40 mm in area. Further, a matrix electrode of 30 vertical and 30 horizontal lines as shown in FIGS. 2a, 2b and 2c was deposited on the front surface of this ceramic plate.

Figure 3A:
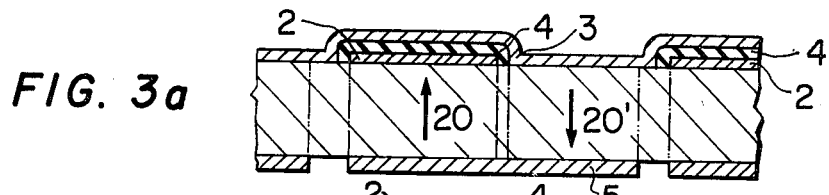
FIGS. 3a and 3b is a longitudinal cross-sectional view and a top surface view showing a movement in the principal part of the matrix element in accordance with the present invention, respectively.
Figure 3B:
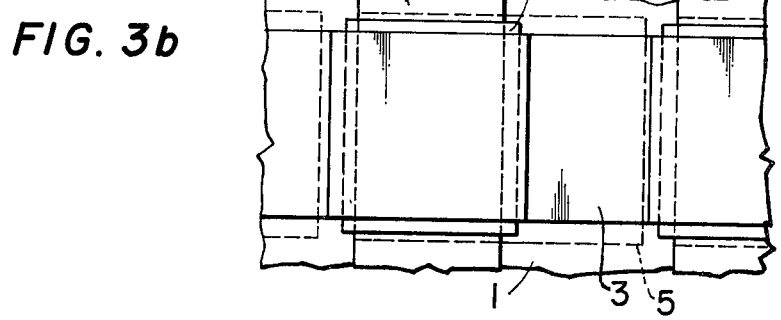

Namely, a plural $In_2O_3 - SnO_2$ (solid solution ratio 91:9 mol%) stripe-shaped film 2 is coated on the said ceramic plate in parallel to the 30 mm side of the said ceramic plate by sputtering. These plural $In_2O_3 - SnO_2$ stripe-shaped film 2 electrodes are coated with 500 μm width, 1200 μm pitch, and 29 mm length. Thus, the stripe-shaped transparent electrodes are provided as shown in FIGS. 2a, 2b, 2c. Furthermore, stripe-shaped transparent electrodes 3 having 600 μm width, 39 mm length, 900 μm pitch were disposed to be orthogonally projected onto the same surface of the ceramic plate so as to provide horizontal and vertical electrodes on the same surface of the said ceramic plate. But, in order to prevent the electric shortage between the horizontal electrodes and vertical electrodes $SiO_2$-insulation layers 4 as shown in FIGS. 3a and 3b are deposited. The Cr – Au layers 11' and 12' are coated onto the end part of the horizontal and vertical electrodes with evaporation. And moreover, Au-lead wires 11 and 12 are bonded onto these electrodes.

Then, $In_2O_3 - SnO_2$ transparent electrodes 5 800 μm × 1000 μm square are deposited independently onto the back surface of this PLZT square plate. However, these independent electrodes on the back surface are deposited on areas corresponding to the crossing and the neighbouring portions of the transparent electrodes 3 and 4 on the ceramic plate. When this ceramic plate is fixed to a supporting frame, the dielectric matrix device fabrication is finished.

Figure 4A:
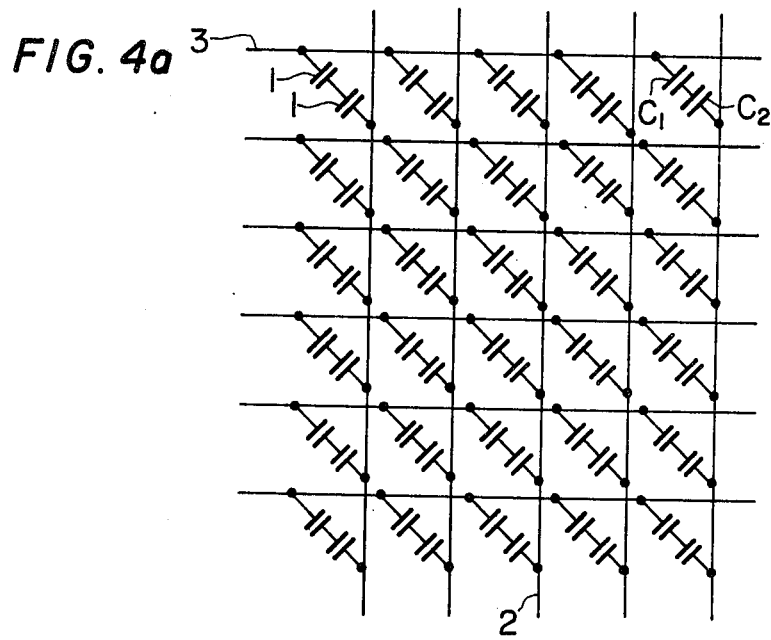
FIGS. 4a and 4b is an equivalent circuit diagram of the matrix device and an equivalent circuit diagram of only one element of the matrix device in accordance with the present invention, respectively.

FIG. 4a shows the equivalent circuit of the said matrix which has 5 × 6 bit-elements. Here, it is clarified that, in contrast to the ordinary matrix structure, every bit of said matrix has a pair of elements connected in series.

Figure 4B:
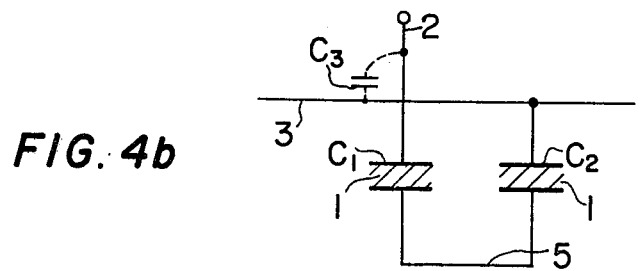

FIG. 4b shows a cross point bit between a certain electrode 2 (vertical electrodes 2) and a certain electrode 3 (horizontal electrodes 3), which has ferroelectric capacitive elements $C_1$ and $C_2$ connected with lead wires 5 corresponding to electrodes 5. The electrodes on $C_1$ and $C_2$ positions are both equal in area, spontaneous polarization 20 and 20' shown in FIG. 3 can connect completely in an anti-parallel orientation as shown with arrows in FIG. 3. Namely, the electrodes 2 and 5 form a condensor $C_1$, and the electrodes 3 and 5 form a condensor $C_2$. Because, the electrodes of condenser $C_1$ and $C_2$ are made from one pair of electrodes, respectively, the condensers $C_1$ and $C_2$ form an equivalent series circuit of the condensors $C_1$ and $C_2$. Because the distances between the electrodes 2 and 3 are short compared to the distances between the electrodes of the condensor $C_1$ and $C_2$, while the value of the dielectric constant of the interposition layer (herein, $SiO_2$) are small, the values of the capacitances $C_3$ being formed by electrodes 2 and 3 are negligible to that of $C_1$ and $C_2$. For example, if we put the value of the distance between every pair of electrodes of condensor $C_1$, $C_2$ and $C_3$, $d_1$: $d_2$: $d_3$ equal 10:10:1, and put the values of the dielectric constant of condenser $C_1$, $C_2$ and $C_3$, $E_1$, $E_2$ and $E_3$ nearly equal to 100:100:4, the capacities of condenser $C_3$ is smaller than half compared to the capacities of condensers $C_1$ and $C_2$. Because, the plate 1 employed in FIG. 4b is a ferroelectric material, its polarization is maintained in a constant value even if the electrodes 2 and 3 are short-circuited, therefore the polarization memory state of the ferroelectric material remains stable.

Namely, the above dielectric matrix element has a function equivalent to an ordinary dielectric matrix element, and can write by voltage coincident driving method, point-at-a-time mode, line-at-a-time mode or random access mode.

Driving method of the above-mentioned dielectric matrix device is that the electric voltage valued $+100$ and $-100$ V applied to the predeterminedly selected pair of the electrodes 2 and 3 for 60 $\mu$s, and all other electrodes out of the pair of the electrode 2 and 3 are connected to ground. By this voltage coincident driving method, only the polarization of the crossed-bit element of the predetermined pair electrode were switched along the thickness direction of the ferroelectric matrix plate.

Next, in a similar way, if both the positively and negatively half-valued electric voltages were applied to second vertical and horizontal electrodes-pairs, simultaneously, then the cross-point-element could be polarized, in succession.

Because the light scattering state of the polarized area is different compared to the light scattering state of the part of the other non-polarized area in this 7/65/35 PLZT plate, the written information can be displayed as a visual pattern.

This writing method is a random access mode. When the random access in the dielectric matrix device is possible, then bit by bit mode and line-at-a-time mode cannot be impossible.

And, when the written information becomes unnecessary to be read out, we have to erase this information from the dielectric matrix panel.

In our present embodiment, the memory written in the element can be erased by means of heating the element beyond 100° C for one minute.

However, because of its slow erasing time, it is an unfavourable method to repeatedly write in or erase a memory.

However, when an alternating current of 150 V, 50 $H_z$ is applied to all horizontal electrodes 2 and all vertical electrodes 3 and then gradually decreasing the amplitude into zero voltage during a few seconds all the elements change to the strongly light scattering state and the stored information in each elements is perfectly erased out. Again, when the information is written in to the ferroelectric memory elements, the direction of the polarization of the written bit-element is oriented to the thickness direction of the element.

Accordingly, the intensity of the scattered light from the said part of the element becomes weaker than the other part of the element, and the written information in the element can be displayed. Namely, when the heat-erasing method was applied to the information written element, the light scattering in the element was decreased, and on the other hand, when the alternated erasing method was applied to the information written elements, the light scattering was increased.

The light scattering intensity from the element being stored information by means of the voltage coincident driving mode is an intermediate state between the thermally depoled state occurring by means the heat-erasing method and the electrical state by the alternating-current erasing method. Accordingly, when digital information is to be written in the element, the displayed pattern can be recognized. But even if the same kind of information was to be written in said element, both images displayed on the heat erasing element and on the alternate-current erasing element have a white and black-reverse relation of negative and positive interrelationship. The stored information in the element is read out by use of the light-detect array device as shown in FIG. 5.

Figure 5:
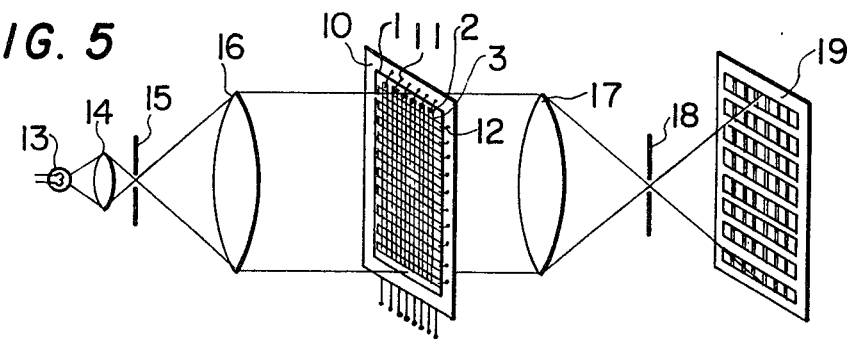
FIG. 5 is a principal constitution diagram of the reading information stored into the matrix device by the light detecting array device.

In FIG. 5, 13 is a 300 Watt Xe lamp, 14 and 17 are lenses, 15 is an aperture disposed in a pre-focus of lens 16, 18 is an aperture disposed in a rear-focus of lens 17, and 19 is a light-detecting array device. Because the non-scattering light transmitted through the element 1 is transmitted through and the scattering light was stored out of the aperture 18, then the scattering light and the non-scattering light are separated from each other. Accordingly, the visual image of the digital pattern stored in the elements is projected onto the light-detecting array. In this state, if the position of the light-detecting array and the position of the image coincide with each other, the optical pattern is transformed to the electric signals.

As the above mentioned process, the electrical write-in and optical read out matrix memory device was fabricated and estimated well. For the sake of the present technology of depositing both the horizontal and vertical electrodes on the same surface, we can make the plate supporting method easy.

Embodiment 2.

With respect to an electrooptic ceramic material wherein a ferroelectric phase and anti ferroelectric phase (or paraelectric phase) coexist exhibiting a morphotropic phase boundary (hereinafter, simply termed MPB) relative to composition changes, an application has been filed as U.S. Pat. No. 3,997,523 Ser. No. 384,225 on July 31, 1973. And moreover, this material, is employed because the change of the effects of the light-scattering between a ferroelectric phase and anti ferroelectric phase (or paraelectric phase) is greater than the light-scattering changes between the other materials.

In the present embodiment, a 7.6/70/30 PLZT material was employed as a representative material.

According to the same manner as mentioned in Embodiment 1, transparent boules in a composition in accordance with the formula $Pb_{0.0924}La_{0.076}(Zr_{0.70}Ti_{0.30})_{0.9-8}O_3$ were made. After that, said boule was sliced into disks, and by optically polishing the sliced surfaces, each disk was fabricated to a 100 $\mu$m thick, 30 mm by 40 mm square plate. Moreover, matrix electrodes of 30 vertical and 30 horizontal lines were coated onto the surface of the above ceramic plate as shown in FIG. 2.

The size of said matrix electrode and the process of the electrode coating was in the same manner as mentioned in Embodiment 1, except Cr - Au terminals 11' and 12' were deposited only one side of the electrodes 2 and 3, in the present Embodiment. Terminals 11' and 12' were deposited onto both ends of the electrodes 2 and 3. The coating of the electrodes employed a Au-evaporated method. The shape, dimension and number of the electrodes was same type as mentioned in Embodiment 1. The back of said element was stuck onto an 1 mm thick and 40 mm × 50 mm square ceramic plate.

The equivalent-circuit of the write-in mode in this Embodiment was same as mentioned in FIG. 4b. However, since the employed material was ceramic material wherein the ferroelectric phase and anti-ferroelectric phase (or paraelectric phase) coexist exhibiting MPB, the transparent state of virgin material employing in the above element was in a non-ferroelectric phase, and the ferroelectric phase was caused at only the cross section between the electrodes 2 and 3. The write-in method of the matrix device in the present invention was in the same manner as described in the above Embodiment 1. However, since the Au-evaporated electrodes of the present element for writing the information was coated onto the back surface of the element, the transmitted light to the element was reflected back by said Au-evaporated electrodes on the back surface of the device. Namely, the stored picture information in the device could be viewed directly.

When the displayed information becomes unnecessary after display, said display is fully erased and a desired new information is stored in turn. And thus, a desired information could be done in a reversible display. The erasing time of the image in the above method is shorter than that in the previously described method. Namely, since the present Embodiment employs the material wherein ferroelectric phase and non-ferroelectric phase coexist at the MPB, the image stored in the device can be erased by applying of a proper amount of the reverse voltage.

The lead wires were connected to both ends of the electrodes 2 and 3, with the sixty lead wires on the both ends of the electrodes 3 all connecting through resistors $R_s'$ to the ground, and alternately supply ten series $-80$ V pulses of 5 ms for 100 ms between the 30 lead wires on the one side and the 30 lead wires on the other hand.

Figure 6A:
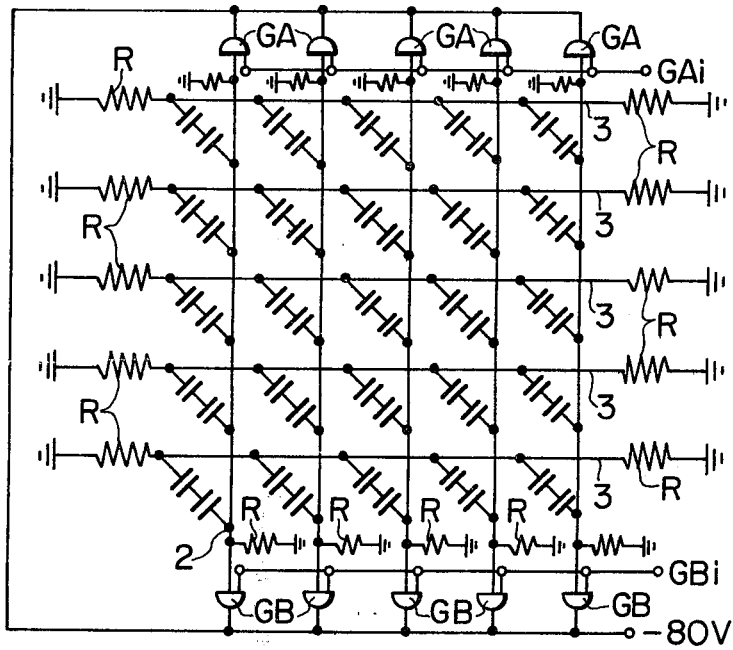
FIG. 6a is an equivalent circuit diagram of an erasing method of a stored information in the matrix device in accordance with the present invention employing a ferroelectric material.

The erasing circuit in this Embodiment was shown in FIG. 6. Every lead wire on both ends of the electrodes 3 leads to ground through the series resistors R, every lead wire on the one end of the electrodes 2 leads to $-80$ V electric source through gate $G_A$, and every lead wire on the other end of the electrodes 2 leads to same $-80$ V electric source through gates $G_B$, and further electrodes being connected to the gates $G_A$ and $G_B'$ were grounded by resistors $R_s'$.

Figure 6B:
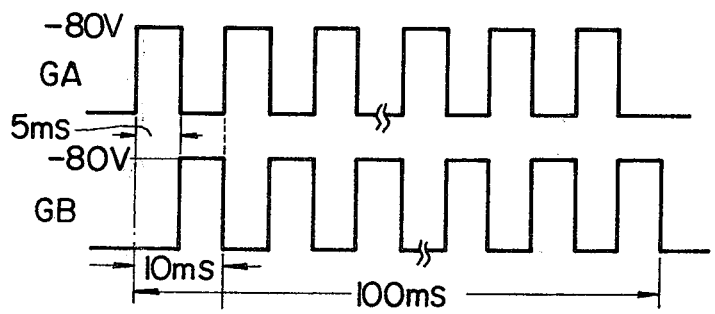

When $G_A$ and $G_B$ alternatively operated open and close ten times of 5 ms period for 0.1, electrodes 2 are subjected to the voltage as shown in FIG. 6b and this resulted in simultaneous application of the reverse voltage for every written polarization and Joule heating by current supplied throughout the electrodes. Taking into consideration of the voltage-drop at electrodes 2, ceramic elements subject to reverse voltage of $-60$ V in average and therefore, the stored image in the device can be erased completely within 0.1 s.

Embodiment 3.

The surface of an alumina ceramic plate of a diameter of 52 mm $\phi$ and a thickness of 2 mm was optically polished and 30 × 30 electrodes 5 having the same shape and the same dimension of 80 $\mu$m × 1000 $\mu$m square were printed by the use of a platinium paste in the back surface of Embodiment 1. After that, a ferroelectric thin film of 1 $\mu$m thick was deposited onto the coating surface of platinum electrodes 5 by sputtering. And further, this ferroelectric thin film was heated in vacuum at 1,150° C for 5 hours. After the heat treatment was finished, the electrodes 2 and 3 having the same shape and the same dimension were evaporated by Al onto said ferroelectric thin film in the same manner as described in Embodiment 1. Here, the insulating film 4, lead wire 11 and 12 was formed in the same method as described in Embodiment 1. Thus, the matrix device employing a ferroelectric thin film of 1 $\mu$m thick was formed.

A test of writing and erasing information into the said thin film elements was carried out by voltage coincidence driving method. According to the result, it is founded that this ferroelectric memory device is possible driving under 5 V.

Namely, the possibility of the matrix device by the present invention was sufficiently evaluated.

Instructive and advantageous features of the present invention were described in detail through the Embodiments 1, 2 and 3. Now, the principle of the present matrix device should be expressed in a short word, hereinafter.

The function of the present matrix device would be understood easily by considering it to form double mirror images having been folded the divided plates as if they were cut along the middle plane in the ordinary ferroelectric memory matrix plate. Here, the independent square electrodes are devised to make possible the idea of folding the double mirror images.

Therefore, the characteristic features of this invention are especially in a electrodes structures and it is concluded that such the ordinary single crystal and ceramic materials as paraelectrics, ferroelectrics, and field-induced ferroelectric materials are all applicable to the plate of the present invention.

I claim:

1. A dielectric matrix device comprising:
   a. a dielectric material plate,
   b. vertical and horizontal electrodes disposed on the same surface of said dielectric plate, said vertical and horizontal electrodes crossing each other at insulated portions thereof, and
   c. a plurality of independent electrodes disposed on the opposite surface of said dielectric plate at portions which correspond to both the areas of crossing of the vertical and horizontal electrodes and areas adjacent to said areas of crossing.

2. A dielectric matrix device according to claim 1, wherein said dielectric material plate is constituted by ferroelectric ceramic material.

3. A dielectric matrix device according to claim 2, wherein each of said independent electrodes forms equivalent capacitive elements respectively with said vertical and horizontal electrodes at said portions which correspond to said areas of crossing and the areas adjacent thereto.

4. A dielectric matrix device according to claim 3, wherein the respective equivalent capacitive elements formed by each independent electrode are connected in series.

5. A dielectric matrix device according to claim 4, wherein said vertical and horizontal electrodes include a matrix of vertical conductive strips and horizontal conductive strips formed on said same surface of said dielectric plate of ferroelectric ceramic material, said vertical and horizontal conductive strips being insulated from each other at said crossing areas by an electrically insulating layer disposed between respective vertical and horizontal strips at each crossing area.

6. A dielectric matrix device according to claim 5, wherein each of said vertical and horizontal electrodes is transparent.

7. A dielectric matrix device according to claim 6, wherein said plurality of independent electrodes include transparent rectangular electrodes formed on said opposite surface of said dielectric plate at said portions which correspond to said areas of crossing and said areas adjacent thereto.

8. A dielectric matrix device according to claim 7, wherein said transparent rectangular electrodes correspond in number to the number of said crossing areas.

9. A dielectric matrix device according to claim 7, wherein said ferroelectric ceramic material of said plate includes lead-lanthanum-zirconium-titanium (PLZT) oxides.

10. A dielectric matrix device according to claim 9, wherein said plate has a composition of 7/65/35 PLZT.

11. A dielectric matrix device according to claim 10, wherein said plate is transparent.

12. A dielectric matrix device according to claim 10, wherein said ferroelectric composition exhibits spontaneous polarization being controllable in the thickness direction of said plate by said capacitive elements.

13. A dielectric matrix device according to claim 12, wherein said plate exhibits different light scattering characteristics for polarized areas than for non-polarized areas.

14. A dielectric matrix device according to claim 9, wherein said plate has a composition of 7.6/70/30 PLZT.

15. A dielectric matrix device according to claim 14, wherein said plate exhibits light scattering between ferroelectric phases and anti-ferroelectric or paraelectric phases of said material.

16. A dielectric matrix device according to claim 15, wherein said ferroelectric phases and anti-ferroelectric or paraelectric phases are reversible.

17. A dielectric matrix device according to claim 14, further comprising a ceramic support plate, wherein said plate of said ferroelectric composition is attached to said ceramic support plate.

18. A dielectric matrix device according to claim 2, further comprising a ceramic support plate, wherein said plate of said ferroelectric material is attached to said ceramic support plate.

19. A dielectric matrix device according to claim 2, wherein said ferroelectric material includes ferroelectric phases and non-ferroelectric phases coexisting with morphotropic phase boundaries therebetween.

20. A dielectric matrix device according to claim 2, wherein said ferroelectric ceramic material of said plate includes lead-lanthanum-zirconium-titanium (PLZT) oxides.

21. A dielectric matrix device according to claim 20, wherein said plate has a composition of 7/65/35 PLZT.

22. A dielectric matrix device according to claim 20, wherein said plate has a composition of 7.6/70/30 PLZT.

23. A dielectric matrix device according to claim 1, further comprising a ceramic support plate, wherein said dielectric plate is attached to said ceramic support plate.

24. A dielectric matrix device according to claim 1, wherein each of said independent electrodes forms equivalent capacitive elements respectively with said vertical and horizontal electrodes at said portions which correspond to said areas of crossing and the areas adjacent thereto.

25. A dielectric matrix device according to claim 1, wherein said vertical and horizontal electrodes include a matrix of vertical conductive strips and horizontal conductive strips formed on said same surface of said dielectric plate, said vertical and horizontal conductive strips being insulated from each other at said crossing areas by an electrically insulating layer disposed between respective vertical and horizontal strips at each crossing area.

26. A dielectric matrix device according to claim 25, wherein said plurality of independent electrodes include rectangular electrodes formed on said opposite surface of said dielectric plate at said portions which correspond to said areas of crossing and said areas adjacent thereto.

27. A dielectric matrix device according to claim 1, wherein said plurality of independent electrodes include rectangular electrodes formed on said opposite surface of said dielectric plate at said portions which correspond to said areas of crossing and said areas adjacent thereto.

* * * * *